United States Patent
Lee (10) Patent No.: US 8,291,306 B2
(45) Date of Patent: Oct. 16, 2012

(54) ENCODER OF CYCLIC CODES FOR PARTIALLY WRITTEN CODEWORDS IN FLASH MEMORY

(76) Inventor: Joseph Schweiray Lee, San Diego, CA (US)

(*) Notice: Subject to any disclaimer, the term of this patent is extended or adjusted under 35 U.S.C. 154(b) by 766 days.

(21) Appl. No.: 12/496,627

(22) Filed: Jul. 1, 2009

(65) Prior Publication Data

US 2010/0005368 A1      Jan. 7, 2010

Related U.S. Application Data (60) Provisional application No. 61/077,495, filed on Jul. 2, 2008.

(51) Int. Cl.
*G06F 11/00* (2006.01)
(52) U.S. Cl. .................................................. 714/800
(58) Field of Classification Search .............. 714/755, 714/786, 800–801, 807
See application file for complete search history.

(56) References Cited

U.S. PATENT DOCUMENTS

| | | | | |
|---|---|---|---|---|
| 6,014,411 A * | 1/2000 | Wang | ............................. | 375/259 |
| 6,574,774 B1 * | 6/2003 | Vasiliev | ......................... | 714/800 |

* cited by examiner

*Primary Examiner* — Shelly A Chase (57) ABSTRACT

Provided is a systematic encoder of cyclic codes for partially written codewords in flash memories wherein all bits of an erased but unwritten area have a default value such as one. In the case where the host writes data to one or a plurality of discontinuous fragments in an area reserved for storing the message section of a codeword in the flash memory, the encoder computes the parity of the codeword by using only the data written to the flash memory as input and by asserting that all bits in the gaps between the written fragments have the default erased value, such that after both the data and the parity are written to the flash memory, the area reserved for storing the codeword would contain a valid codeword. On read back, the host reads the entire codeword area from the flash memory without having to distinguish between the written and unwritten fragments.

8 Claims, 11 Drawing Sheets

ENCODER OF CYCLIC CODES FOR PARTIALLY WRITTEN CODEWORDS IN FLASH MEMORY

PRIORITY APPLICATION

This application claims the benefit under 35 U.S.C. 119(e) of U.S. Provisional Application 61/077,495 (filed Jul. 2, 2008). The entire disclosure of this application is hereby incorporated by reference herein.

COPYRIGHT RIGHTS

The disclosure of this patent document contains material that is subject to copyright protection. The copyright owner has no objection to the facsimile reproduction by any one of the patent document or the patent disclosure, as it appears in the Patent and Trademark Office patent file or records, but otherwise reserves all copyright rights whatsoever.

BACKGROUND OF THE INVENTION

The present invention relates generally to the encoding of Cyclic Codes. More specifically, the present invention is related to encoding Cyclic Codes in data storage systems where the storage medium, such as the flash memory, has a default value such as one for all bits after the medium is erased but not yet written with data.

The storage media in the flash memory is segmented into units such as blocks and pages. Usually a block contains multiple pages. The block is a unit for data erasure while the page is a unit for data read/write. A data erasure causes a block to be "erased", which means forcing all bits in the block to a default value such as one. For the host to overwrite an already written page with new data, the block containing the page would be erased before the page is written with new data. Hereinafter, an "unwritten" area refers to an area which has been erased but has not been written with data. If the host writes only portions of an erased area, then all bits in the unwritten portions of the area would retain the default value.

Error correction coding (ECC) is often used in data storage systems to protect the integrity of the data stored in the storage medium against data-corrupting conditions such as storage medium defects, random read errors, etc. Cyclic Codes, which are linear block codes, are a class of error correction codes which is often favored over other classes of codes due to their algebraic properties which lead to very practical implementations of the encoding and decoding algorithms.

Figure 1:
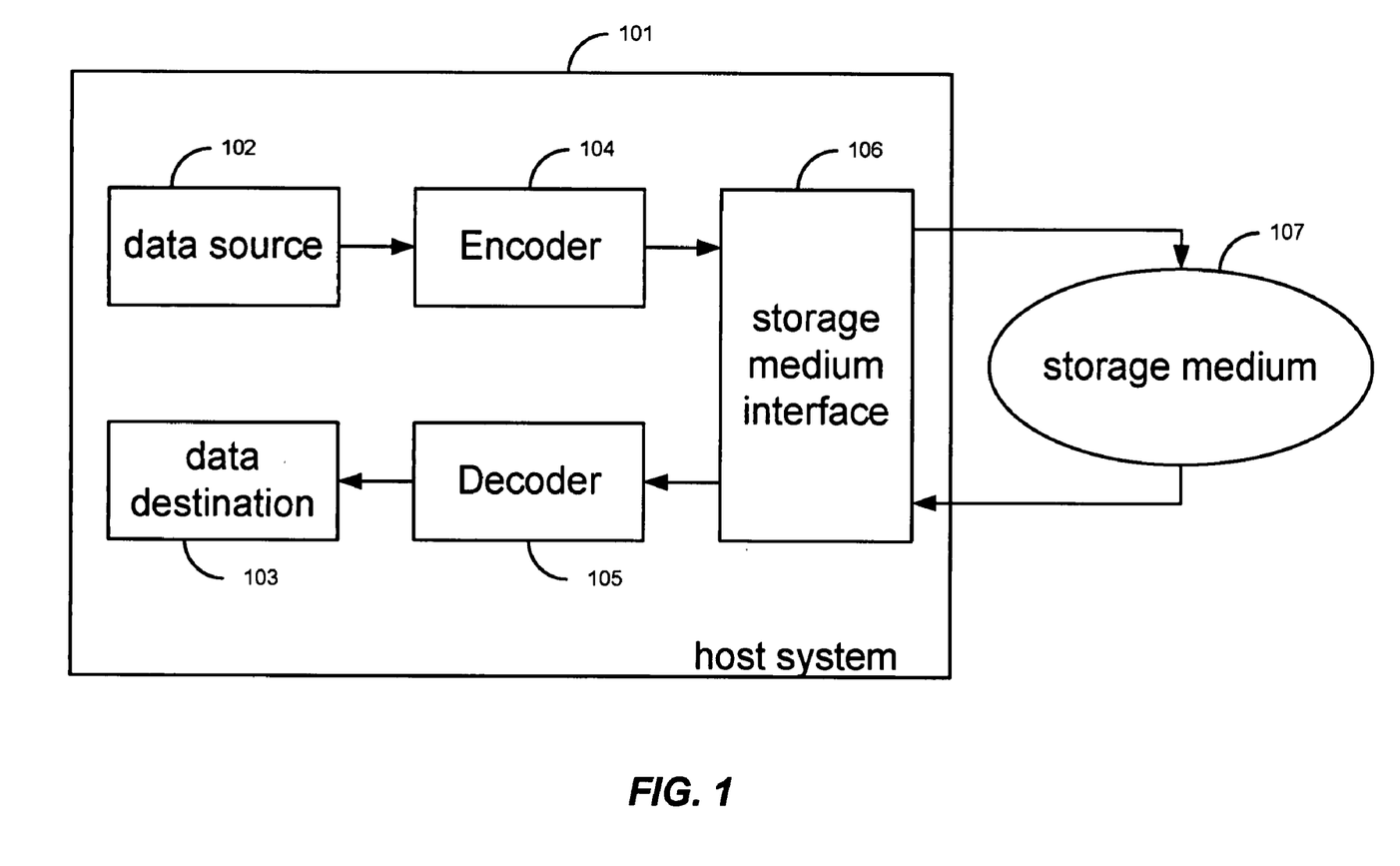
FIG. 1 illustrates a generalized error correction coding scheme in a data storage system

FIG. 1 illustrates a generalized error correction coding scheme in a data storage system (101). On write, the data generated by the data source (102) are sent to the Encoder (104) to be encoded. The encoded data are then sent to the storage medium interface (106) which manipulates the encoded data into a format suitable for being stored in the storage medium (107). The storage medium interface (106) varies tremendously among different systems according to the specific characteristics of the storage medium. Conversely on read, the storage medium interface (106) reads the stored data from the storage medium (107) potentially with errors and recovers the encoded data format, which is sent to the Decoder (105) where the original data from the data source (102) are recovered and sent to the data destination (103). The present invention focuses on the Encoder (104) of the host system (101).

With an (n, k) linear block code, encoding maps a sequence of k message symbols into another sequence of n symbols, where n>k. The resultant sequence of n symbols is commonly referred to as a "codeword" which is sent to the storage medium interface to be stored in the storage medium. Encoding methods are generally divided into two categories, namely the systematic and the non-systematic encoding. With systematic encoding, the message appears in the codeword itself, occupying the first k symbols of the codeword. Therefore, systematic encoding basically calculates n−k parity symbols based on the k message symbols and attaches the parity symbols to the message symbols to form the codeword. On the other hand, with non-systematic encoding, the message does not necessarily appear in its corresponding codeword. The present invention focuses on systematic encoding. The message in a systematic codeword is also referred to as the "message section".

When ECC is applied to the flash memory, the host system typically segments data to be written to the flash memory into "messages" and employs an ECC encoder to encode each message into a codeword which is physically stored in the flash memory. In the present invention, the area in flash memory reserved for storing each codeword is referred to as the "flash codeword area". If systematic encoding is used, then each flash codeword area contains two sub-areas, namely the "flash message area" and the "flash parity area", which are used to store the "message" and the "parity" of the codeword, respectively.

"Error Control Coding: Fundamentals and Applications" by Lin & Costello, Copyright 1983 by Prentice-Hall, Inc. with ISBN 0-13-283796-X, (hereinafter "Lin & Costello") is incorporated by reference herein. Lin & Costello discloses in Section 4.3, pp. 95~pp. 98, a systematic encoder for an (n, k) cyclic code based on the generator polynomial of the code, which is hereinafter referred to as the prior-art "base encoder".

Figure 2:
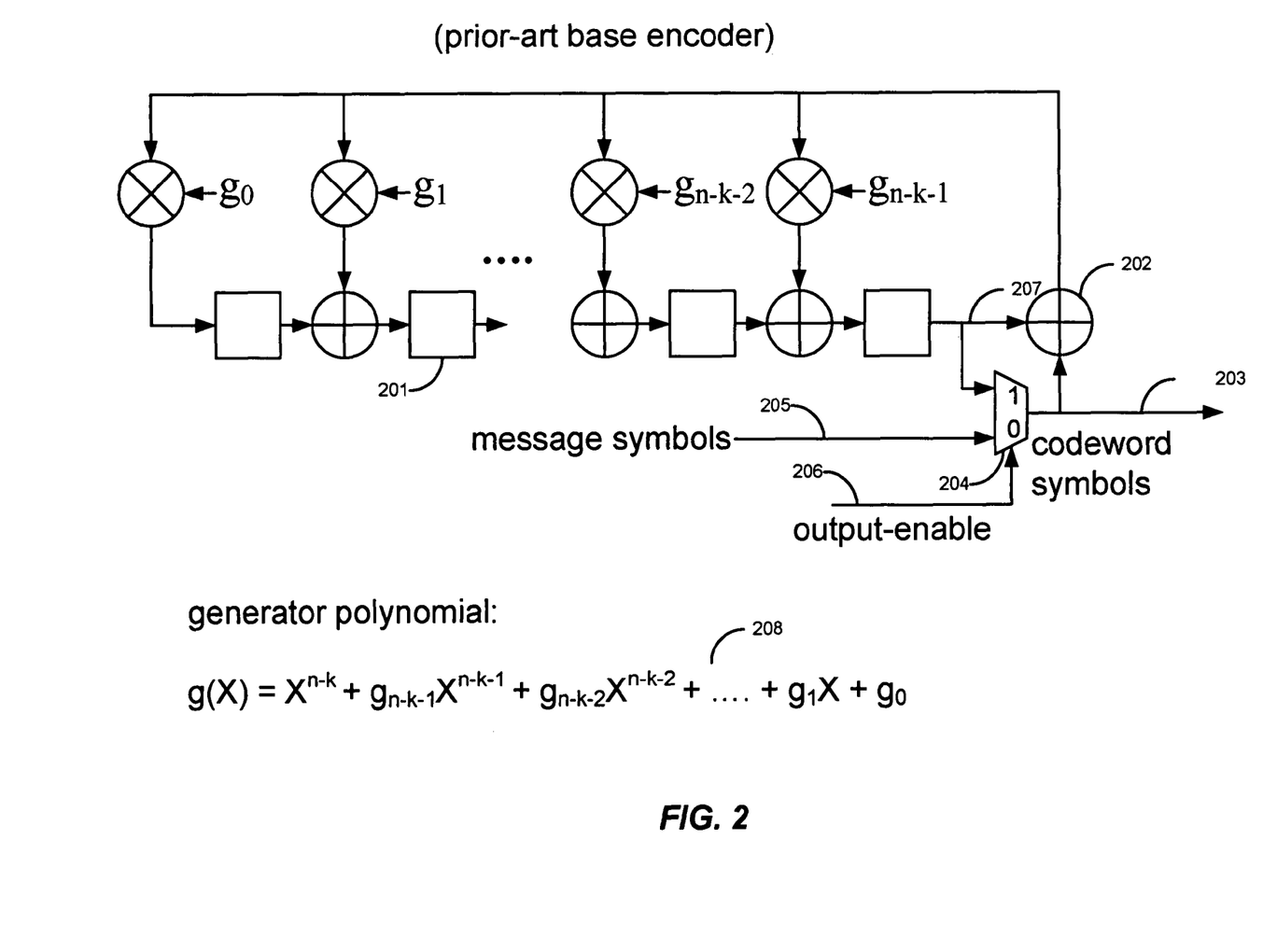
FIG. 2 illustrates a prior-art systematic (n, k) Cyclic Code encoder.

As illustrated in FIG. 2, the prior-art base encoder is a feedback shift register (FSR). Before encoding, the FSR is cleared to zero. To encode a message, the message symbols are input (205) at a rate of one symbol per cycle while "output-enable" (206) has the value of zero which causes the multiplexer (204) to pass each message symbol into the adder (202) as well as to the output (203) as a codeword symbol. After all k message symbols have entered the encoder, the n−k parity symbols are obtained and stored in the registers (201). The value of output-enable is then changed to one, which causes the parity symbols (207) to be shifted out (203) at a rate of one symbol per cycle. As a consequence, the systematically encoded codeword appears at output signal (203) at a rate of one symbol per cycle.

Theoretically, the FSR obtains the n−k parity symbols after all k message symbols have been input. In the case where the first j of the k message symbols are zeros, the FSR remains zeros during the input of the first j message symbols, and only begins to have nonzero values after the first nonzero message symbol is input. In other words, inputting the first j zero symbols does not change the FSR from its reset state. Therefore, to encode a k-symbol message whose first j symbols are zeros, the host only needs to input the last (k−j) message symbols to the encoder. This property of the prior-art base encoder is helpful because, for various application-specific reasons, such as the size of the flash memory page, the host may choose to encode a message of less than k symbols, e.g. (k−j) symbols, into a codeword. Mathematically, the n-symbol codeword obtained this way has the first j symbols being zeros followed by (k−j) message symbols followed by (n−k) parity symbols. If the decoder's syndrome computer has a similar property, i.e., reading zero symbols does not change the syndrome computer from its reset state, then the first j zero symbols of the codeword do not need to be physically stored in the flash memory, and thus savings are achieved in both storage space and data transfer times.

Although the prior-art base encoder allows the host to input a shorter message of (k−j) symbols, the host is still required to input the (k−j) message symbols to the encoder continuously without any gap. Further, the input message symbols are immediately followed by the parity in the codeword without any gap. In certain applications, the host may need to write to one or a plurality of discontinuous fragments in the flash message area, leaving the gaps between these fragments unwritten, and/or leaving the gap between message and parity unwritten. In these applications, there are two scenarios where the prior-art base encoder may be used. In the first scenario, the host inputs only the message symbols to the encoder even though the message is written to physically discontinuous fragments in the flash message area. In other words, the parity of a codeword is calculated based on only the written fragments, and not gaps between them. On read back, since the gaps between the written fragments are not a part of the codeword, the host must have prior knowledge of the exact pattern of the written fragments in the flash message area and provide only data read from the written fragments to the decoder. Thus, the exact pattern of the written fragments needs to be recorded for each codeword written to flash memory, which may not be practical since the complexity and resources involved in recording such information after writing each codeword is tremendous. In the second scenario, the host provides not only the data fragments to be written to the flash memory, but also the unwritten gaps having bits of the default value, to the encoder. In other words, a continuous data sequence which mimics the flash message area, including the written fragments and unwritten gaps, is input to the encoder as the message section of the codeword. On read back, the host reads the entire flash message area without having to distinguish between the written fragments and unwritten gaps for the decoder. However, for a large flash message area with a small amount of written data, this method is both time and power wasting since the encoder must iterate through the large unwritten gaps to calculate the parity.

Hereinafter, the section of the message that the host writes to a fragment in the flash message area, whereby data is written continuously within the fragment but discontinuously from all other fragments, is referred to as a "data fragment". Further, the term "gaps" not only refers to the physical space between the fragments in the flash message area, but also refers to the data stored in said physical space where all bits have the default value such as one when random errors are absent.

Therefore, it would be advantageous to have an encoder which computes the parity of a codeword by using only the data fragments as input and by asserting that the all bits in the gaps have the unwritten default value. With such an encoder, the host would only need to input the data fragments to the encoder as the message section of the codeword. On read back, the entire flash codeword area is read and input to the decoder without the need to distinguish the written fragments from the gaps.

Other than the prior-art base encoder, this invention references two more prior-art encoders, as described below.

Lin & Costello further discloses in Section 4.3, pp. 95~pp. 98, a systematic encoder for an (n, k) cyclic code based on the parity polynomial of the code, which is referenced in the present invention and is hereinafter referred to as the prior-art "parity-polynomial-based encoder".

U.S. Published Patent Application No. 20090077449 by Lee, entitled "Methods and Apparatus for Encoding and Decoding Cyclic Codes by Processing Multiple Symbols Per Cycle" and incorporated by reference herein, discloses a systematic cyclic code encoder which is based on the generator polynomial of the cyclic code and may be configured to process M symbols per cycle, whereby M is an integer greater than or equal to one. This encoder is hereinafter referred to as the prior-art "M-symbol-per-cycle encoder".

SUMMARY OF THE INVENTION

An encoding apparatus hereinafter referred to as the "Encoder" is provided which computes the parity of a codeword by using only the data fragments as input and by asserting that the all bits in the gaps have the value of zero. The Encoder comprises a "Symbol Counter Unit" which indicates the position of each symbol being input to the Encoder, a "Base Parity Unit" which computes the "base parity" for each data fragment as if the data fragment is the only message of a codeword and located immediately above the parity in the codeword, a "Fragment Parity Unit" which computes a "fragment parity" by treating the base parity mathematically shifted to the symbol position provided by the Symbol Counter Unit as the message, and a "Codeword Parity Unit" which computes the codeword parity by iteratively vector-summing the fragment parities as each fragment parity is output by the Fragment Parity Unit. The Encoder further optionally comprises a multiplexer which selects the data fragments as output of the Encoder as they are input by the host, and selects the codeword parity as output of the Encoder after the codeword parity has been computed by the Encoder.

In the present invention, the "position" of a symbol refers to the position of the symbol within a codeword. A codeword of n symbols may be represented by a codeword polynomial of degree n−1, wherein the coefficient of each term represents a symbol of the codeword. The "position" of a symbol is the degree of the corresponding term in the codeword polynomial. Thus, the first symbol of the codeword has position n−1, while the last symbol of the codeword has the position 0.

Before inputting each data fragment, the host loads the position of the first symbol of the data fragment into the Symbol Counter Unit. As the host inputs each symbol of the data fragment, the Symbol Counter Unit decrements the symbol position count by one while the Base Parity Unit iterates once using the input symbol. After the host finishes inputting the data fragment, the base parity for said data fragment is contained in the Base Parity Unit. The Fragment Parity Unit then treats the base parity mathematically shifted to the symbol position indicated by the Symbol Counter Unit as a message, and computes the fragment parity for that message. Then the Codeword Parity Unit computes the codeword parity by performing a bit-wise XOR between the fragment parity currently output by the Fragment Parity Unit and all previously computed fragment parities. After the host has transferred all data fragments of the message section of the codeword, the Codeword Parity Unit contains the codeword parity, which the host then writes to the flash parity area.

The Encoder described above works with flash memory whose default value of unwritten bits is zero. In the case where the default value of unwritten bits is one, an inverter is placed on the data path both to and from the flash memory. In other words, the data fragments and the parity output by the Encoder are bit-wise inverted when being written to the flash memory. On read back, the codeword read from the flash memory, including the data fragments, gaps and the parity, is bit-wise inverted again before entering the decoder.

In the case where it is fixed that there is always only one data fragment in the message section of each codeword, then the Encoder does not need to comprise the Codeword Parity Unit, and the fragment parity output by the Fragment Parity Unit is the final parity for the codeword.

In the first embodiment, the prior-art base encoder is used as the Base Parity Unit, while a prior-art M-symbol-per-cycle encoder is used as the Fragment Parity Unit. In the second embodiment, a prior-art M-symbol-per-cycle encoder is used as both the Base Parity Unit and the Fragment Parity Unit. In the third embodiment, any prior-art encoder is used as the Base Parity Unit, while a parity-check-polynomial-based encoder is used as the Fragment Parity Unit.

DETAILED DESCRIPTION OF THE FIRST PREFERRED EMBODIMENT

Figure 5:
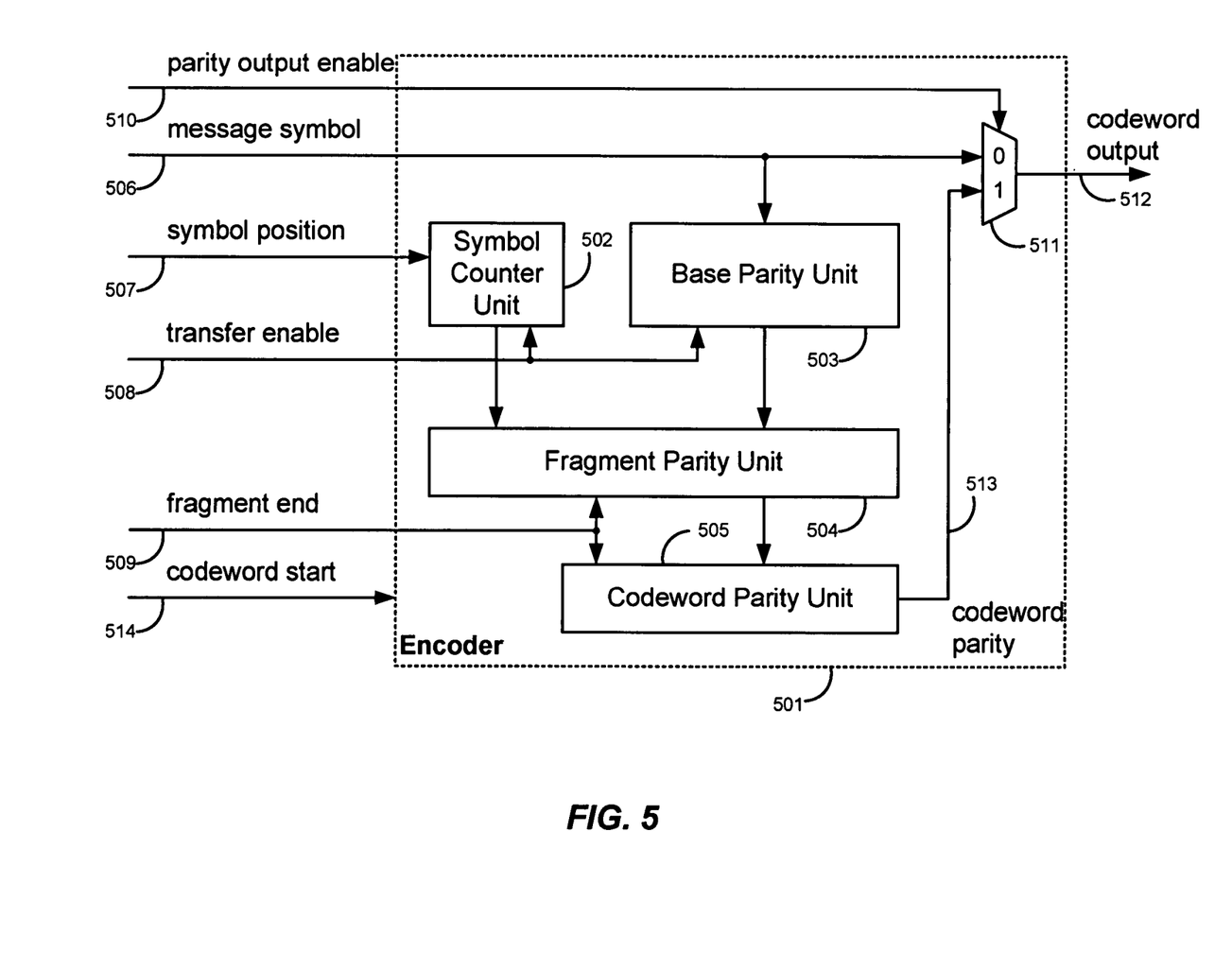
FIG. 5 illustrates an overview of the Encoder of the current invention.

FIG. 5 illustrates an overview of the Encoder of the current embodiment, whereby the Encoder (501) comprises a "Symbol Counter Unit" (502), a "Base Parity Unit" (503), a "Fragment Parity Unit" (504), a "Codeword Parity Unit" (505) and optionally a multiplexer (511). In the current embodiment, the Base Parity Unit may be implemented with the prior-art base encoder, while the Fragment Parity Unit may be implemented with the prior-art M-symbol-per-cycle encoder.

Before transferring each data fragment, the host pulses the "codeword start" (514) signal to clear the registers in the Base Parity Unit (503) and the Codeword Parity Unit (505), and loads the position of the first symbol of the data fragment into the Symbol Counter Unit (502) via an input signal "symbol position" (507). Then the host begins to input the symbols of the data fragment via the "message symbol" signal (506). For each input symbol, the "transfer enable" signal (508) is asserted to cause the Symbol Counter Unit to decrement the symbol position count by one and the Base Parity Unit (503) to iterate once using the input message symbol (506) as input. Meanwhile, the "parity output enable" signal (510) is unasserted to cause the multiplexer (511) to pass the input message symbol to the flash memory via the "codeword output" signal (512). After the host finishes inputting each data fragment, the base parity is contained in the Base Parity Unit and is output to the Fragment Parity Unit. Then the "fragment end" signal (509) is pulsed to cause the Fragment Parity Unit (504) to compute the fragment parity for a message consisting of the base parity mathematically shifted to the symbol position indicated by the Symbol Counter Unit. The "fragment end" signal also clears the registers in the Base Parity Unit for the next data fragment. Meanwhile, the Codeword Parity Unit (505) computes an accumulated codeword parity by performing a bit-wise XOR between the current fragment parity and all previously computed fragment parities. This process is repeated for each data fragment. After the host has transferred all data fragments of the message section, the Codeword Parity Unit contains the final codeword parity, and the "parity output enable" signal (510) is asserted to cause the multiplexer (511) to pass the codeword parity to the "codeword output" signal (512).

Figure 3:
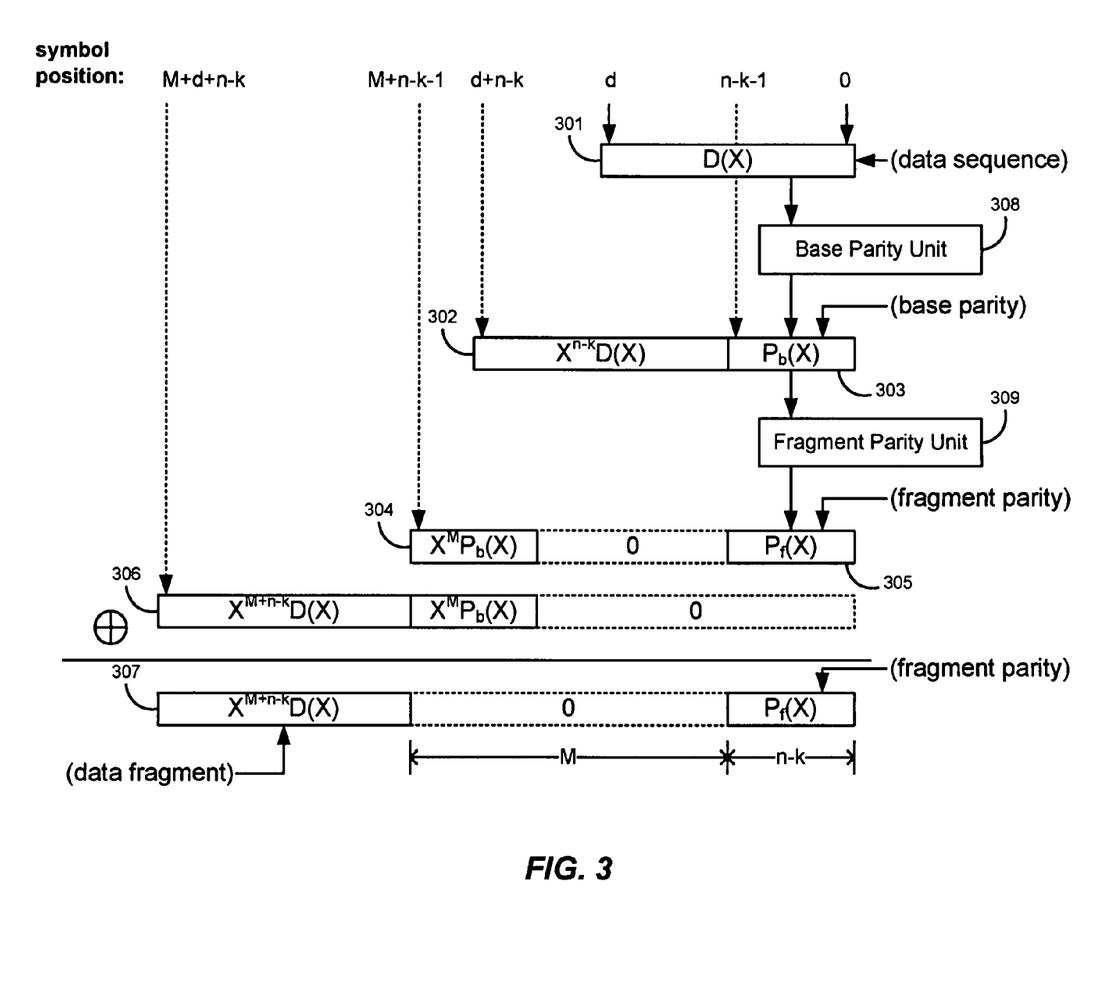
FIG. 3 illustrates a polynomial representation of a data fragment and its corresponding base parity and fragment parity computed by the Base Parity Unit and the Fragment Parity Unit, respectively.

FIG. 3 illustrates a polynomial representation of a data fragment placed M symbols above the parity and its corresponding base parity and fragment parity computed by the Base Parity Unit and the Fragment Parity Unit, respectively.

A data sequence of (d+1) symbols may be represented by a polynomial $D(X)$ (301) having a degree d. The Base Parity Unit (308) takes $D(X)$ as input and computes a base parity $P_b(X)$ (303) of n−k symbols to form a valid codeword (302) represented by $X^{n-k}D(X)+P_b(X)$. The message section of this codeword consists of $D(X)$ placed immediately above the parity $P_b(X)$. In other words, the Base Parity Unit serves as a typical systematic (n, k) Cyclic Code encoder and thus may be implemented with the prior-art base encoder illustrated in FIG. 2.

The Fragment Parity Unit (309) then takes the base parity $P_b(X)$ as input and computes a fragment parity $P_f(X)$ (305) of n−k symbols to form a valid codeword (304) represented by $X^M P_b(X)+P_f(X)$. The message section of this codeword consists of $P_b(X)$ mathematically shifted M symbol positions higher, where $M \leq k-d-1$. Depending on the value of M, the n−k message symbols represented by $X^M P_b(X)$ may or may not be placed immediately above the parity $P_f(X)$, i.e., there may be gaps of zeros between the message $X^M P_b(X)$ and the parity, thus the Fragment Parity Unit is not implemented with a prior-art base encoder. Rather, the Fragment Parity Unit is a systematic (n, k) cyclic code encoder which computes parity for a codeword whose message section consists of a span of n−k continuous message symbols which may be located anywhere in the message section, by using these n−k message symbols as input and not the gaps of zero symbols.

Recall that $X^{n-k}D(X)+P_b(X)$ is a valid codeword (302) formed by the Base Parity Unit. According to the definition of the Cyclic Codes, cyclically shifting this codeword M positions higher results in another valid codeword (306) represented by $X^{M+n-k}D(X)+X^M P_b(X)$. Note that since $M \leq k-d-1$, the degree of this polynomial is at most n−1. Recall also that $X^M P_b(X)+P_f(X)$ is a valid codeword (304) formed by the Fragment Parity Unit. According to the definition of the Linear Block Codes, the vector sum of any two valid codewords results in another valid codeword. Therefore, the vector sum of the codeword (304) and the codeword (306) is also a valid codeword (307) represented by $X^{M+n-k}D(X)+P_f(X)$.

It can be seen in the codeword (307) that the fragment parity $P_f(X)$ computed by the Fragment Parity Unit, using the base parity $P_b(X)$ as input, is the parity of a codeword whose message section consists of the data sequence $D(X)$ placed M symbol positions above the parity. In other words, there are M zero symbols in the gap between the data sequence and the parity in this codeword, but the computation of the parity does not require the host to input the gap of M zero symbols.

Figure 4:
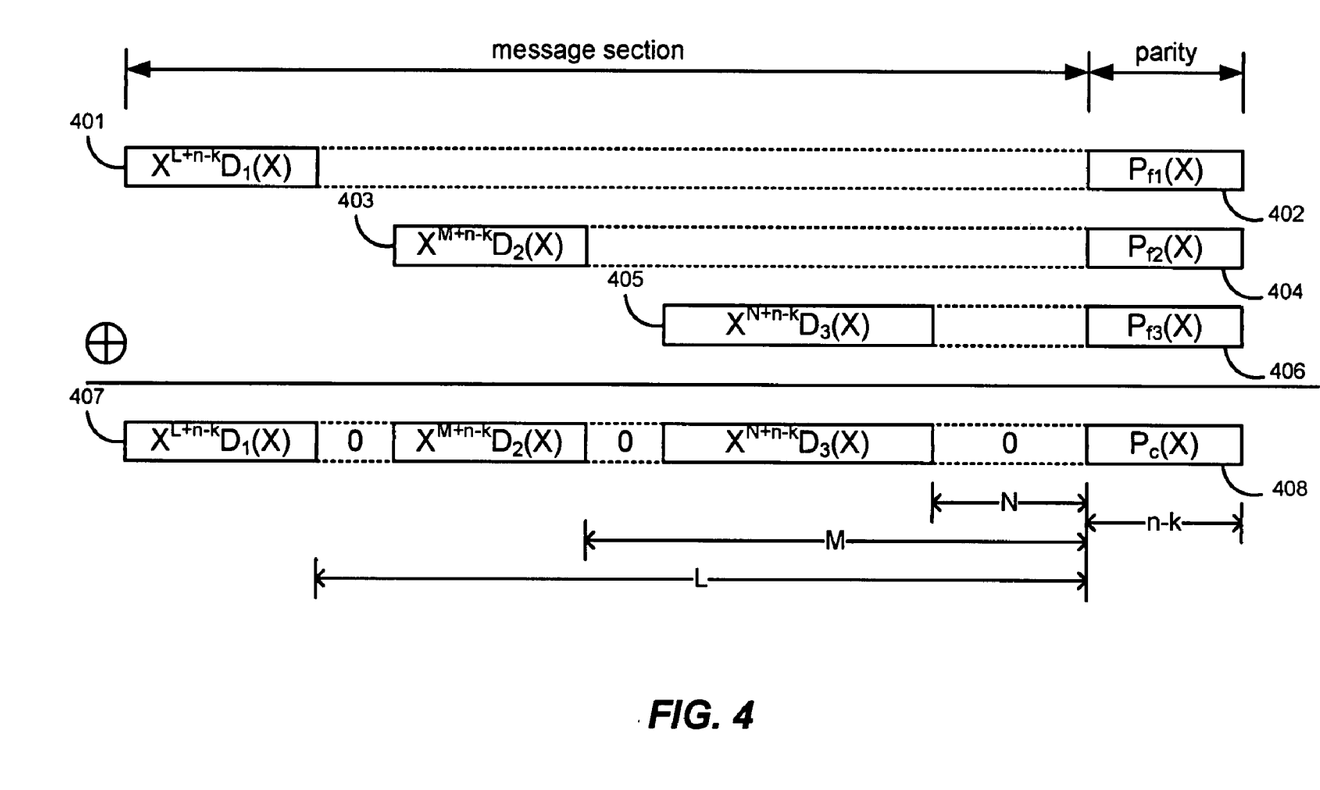
FIG. 4 illustrates a polynomial representation of a codeword comprising multiple data fragments and their corresponding fragment parities, as well as the codeword parity.

As FIG. 4 illustrates, if the host intends to write multiple data fragments, e.g. $D_1(X)$, $D_2(X)$, $D_3(X)$, to discontinuous fragments (401, 403, 405) in the flash message area, the fragment parity (402, 404, 406) of each data fragment can be individually computed as described above. Since each data fragment and its corresponding fragment parity form a valid codeword, using again the definition of the Linear Block Codes, the vector sum of all data fragments and all fragment parities also results in a valid codeword (407). Therefore, the vector sum of all fragment parities (402, 404, 406) is the codeword parity $P_c(X)$ (408) for the codeword (407) whose message section consists of the three data sequences located at three discontinuous data fragments with gaps filled with zeros.

In the current invention, the Codeword Parity Unit serves as the accumulator of fragment parities by vector-summing each fragment parity output by the Fragment Parity Unit with all previously computed fragment parities for the current codeword.

Figure 6:
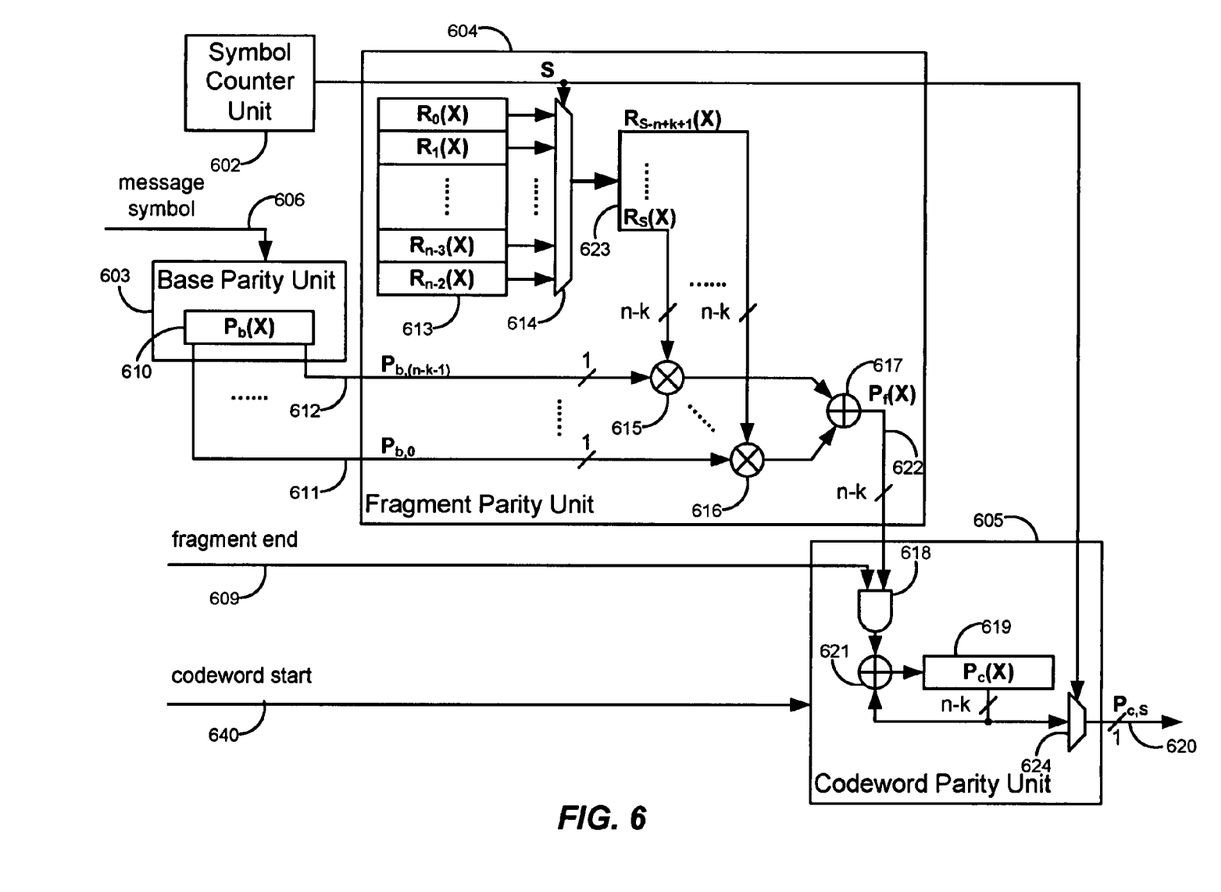
FIG. 6 illustrates a more detailed view of the Encoder of the first embodiment.

FIG. 6 illustrates a more detailed view of the Base Parity Unit (603), the Fragment Parity Unit (604) and the Codeword Parity Unit (605) of the current embodiment.

In the current embodiment, the Base Parity Unit may be implemented with the prior-art base encoder. The Base Parity Unit (603) comprises a register (610) which contains the base parity $P_b(X)$ after the host has input all symbols of a data fragment via the message symbol signal (606). The register may be cleared by either the "codeword start" signal (640) or the "fragment end" signal (609). Further, the entire register content may output to the Fragment Parity Unit in one cycle via signals (611, 612).

In the current embodiment, the Fragment Parity Unit may be implemented with the prior-art M-symbol-per-cycle encoder configured to process n−k symbols per cycle. The Fragment Parity Unit (604) comprises a lookup table (613) with n−1 entries indexed from 0 to n−2, whereby each entry "i" contains a pre-calculated remainder polynomial $R_i(X)$ resulting from dividing an identity polynomial of degree "i" by the generator polynomial $g(X)$ of the (n, k) Cyclic Code. An identity polynomial is defined as a polynomial having only one nonzero term with a coefficient of one. For example, an identity polynomial of degree 6 is $X^6$. Therefore, the table entry "i" contains the remainder polynomial $R_i(X)$ resulting from dividing $X^i$ by $g(X)$. Note that since $g(X)$ has degree n−k, the degree of a remainder polynomial is at most n−k−1, and that table entries 0 to n−k−1 contain simply the identity polynomials of degrees 0 to n−k−1, respectively. A multiplexer (614) selects n−k entries from the n−1 entries of the lookup table as the table output (623). The select signal is provided by the symbol position count from the Symbol Counter Unit (602) and, for a symbol position count of value S, the multiplexer selects n−k entries indexed from S to S−n+k+1 which contain $R_S(X)$, ..., $R_{S-n+k+1}(X)$ to n−k scalar multipliers (615, 616), respectively. The scalar multipliers (615, 616) each multiplies a coefficient of the base parity $P_b(X)$ (610) with a corresponding remainder polynomial of the table output (623), whereby the remainder polynomial of the lowest index $R_{S-n+k+1}(X)$ is multiplied by the lowest base parity coefficient $P_{b,0}$ (611), and the remainder polynomial of the highest index $R_S(X)$ is multiplied by the highest base parity coefficient $P_{b,n-k-1}$ (612). The n−k polynomials output by the scalar multipliers are vector-summed by a bit-wise XOR gate (617), which outputs the fragment parity $P_f(X)$ (622).

The Codeword Parity Unit (605) comprises a register (619) which is capable of storing n−k symbols and may be cleared by the "codeword start" signal (640), an AND gate (618) which conditionally passes the fragment parity (622) when the value of the "fragment end" signal (609) is one, and a bit-wise XOR gate (621) which performs vector sum of the register content and the AND gate output. Before an encoding operation starts, the register (619) is cleared to zero by the "codeword start" signal (640). After each data fragment has been input at (606), the "fragment end" signal is asserted to cause the fragment parity $P_f(X)$ (622) and the register content (619) to be vector-summed by the XOR gate (621) with the result vector loaded back into the register. After all data fragments have been input at (606), the register contains the codeword parity $P_c(X)$. The Codeword Parity Unit optionally comprises a multiplexer (624) which passes one coefficient from the codeword parity $P_c(X)$ according to the symbol position count provided by the Symbol Counter Unit (602) to the codeword parity output (620). After all data fragments for the codeword have been input at (606) and the codeword parity $P_c(X)$ has been obtained and stored in register (619), the Symbol Counter Unit is loaded with the value n−k−1 and then begins to decrement by one per cycle to the value of zero to cause the multiplexer (624) to output codeword parity symbols $P_{c,n-k-1}$, ..., $P_{c,0}$, one symbol per cycle.

Figure 7:
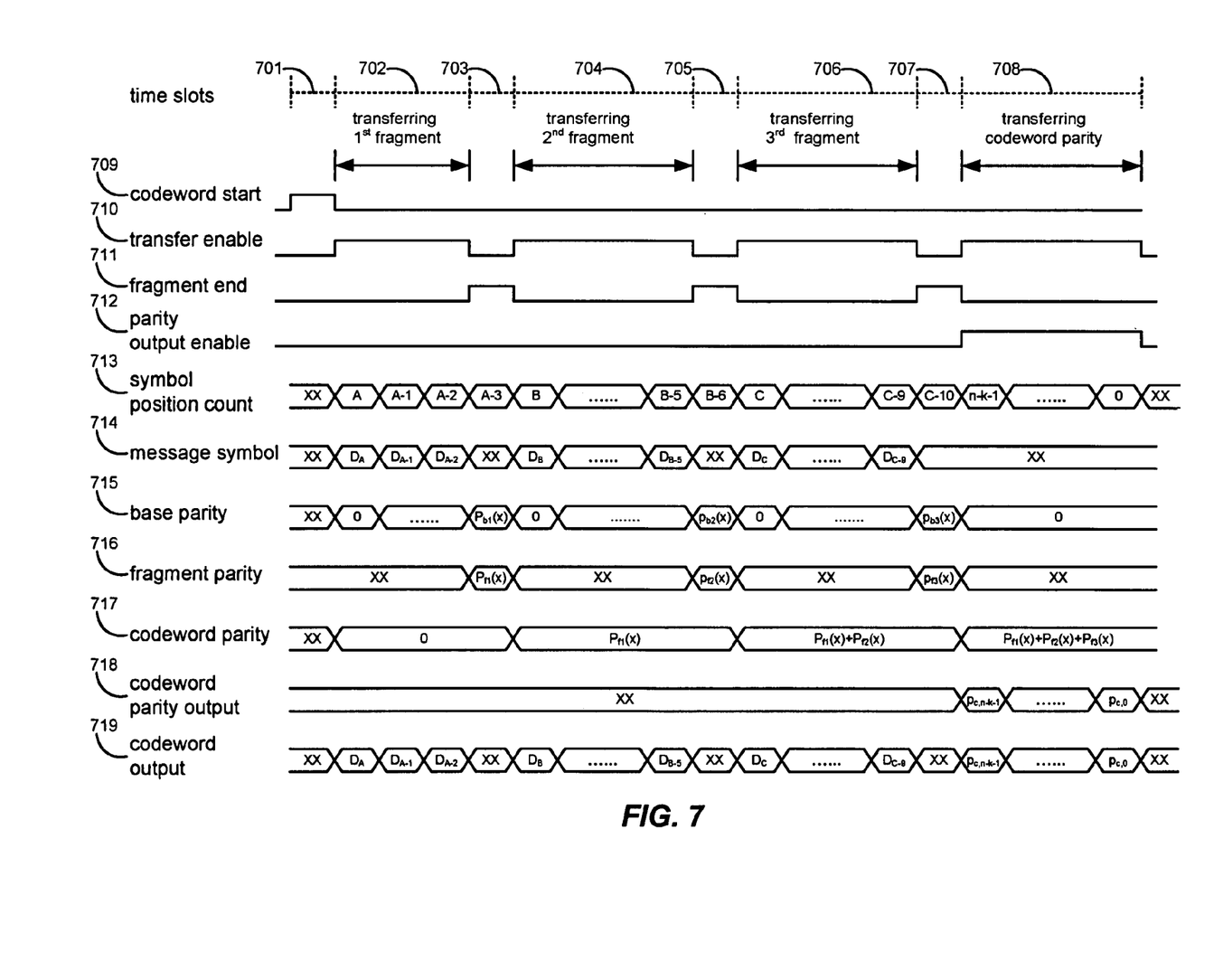
FIG. 7 illustrates an exemplary operation of the encoding process of the first and the second embodiments in terms of signal timing diagrams.

FIG. 7 illustrates an exemplary encoding operation of the current embodiment in terms of signal timing diagrams. In this exemplary encoding operation, the host writes three data fragments starting at symbol positions A, B and C and having a length of 3, 6 and 10 symbols, respectively, to the flash message area. In FIG. 7, base parity (715), fragment parity (716) and codeword parity (717) represent values of the base parity register (610), fragment parity (622) and codeword parity register (619) in FIG. 6, respectively, while codeword parity output (718) and codeword output (719) represent values of the "codeword parity" signal (513) and the "codeword output" signal (512) in FIG. 5, respectively.

In time slot (701), the "codeword start" signal (709) is asserted to cause the registers holding the base parity (715) and the codeword parity (717) to be cleared to zero. Meanwhile, the host loads the starting symbol position of the first data fragment, A, to the Symbol Counter Unit (713). In time slot (702), the host keeps the "transfer enable" signal (710) asserted and inputs consecutively the 3 symbols of the first data fragment ($D_A$, $D_{A-1}$, $D_{A-2}$) and, for each symbol, the Base Parity Unit iterates once and the Symbol Counter Unit decrements the symbol position count by one. In time slot (703), the "fragment end" signal is asserted to indicate that the transfer of the first data fragment has finished. Since the base parity for the first data fragment $P_{b1}(X)$ is now output by the Base Parity Unit, the Fragment Parity Unit computes and outputs in the same time slot the fragment parity $P_{f1}(X)$ to the Codeword Parity Unit, which records $P_{f1}(X)$ in its register (717) at the end of time slot (703). Note that the symbol position count (A−3) in this time slot is one less than the position of the last symbol of this data fragment $D_{A-2}$. Meanwhile, the base parity register is again cleared to zero, while the Symbol Counter Unit is loaded with the starting symbol position of the second data fragment, B. In time slot (704), the operation of time slot (702) is repeated for the second data fragment, whereby the host inputs consecutively six symbols of the second data fragment ($D_B$, ..., $D_{B-5}$). In time slot (705), the operation of time slot (703) is repeated for the second data fragment, i.e., the Base Parity Unit outputs the base parity for the second data fragment $P_{b2}(X)$ while the Fragment Parity Unit outputs the fragment parity $P_{f2}(X)$ to the Codeword Parity Unit, which performs $P_{f1}(X)+P_{f2}(X)$ and loads the sum in its register. Meanwhile, the Symbol Counter Unit is loaded with the starting symbol position of the third data fragment, C. In time slots (706, 707), the operation of time slots (704, 705) is repeated for the third data fragment. In time slot (707), the Base Parity Unit outputs the base parity $P_{b3}(X)$ while the Fragment Parity Unit outputs the fragment parity $P_{f3}(X)$ to the Codeword Parity Unit, which performs $[P_{f1}(X)+P_{f2}(X)]+P_{f3}(X)$ and loads the sum in its register. Meanwhile, the Symbol Counter Unit is loaded with n−k−1. In time slot (708), the Symbol Counter Unit decrements the symbol position count by one for each cycle for n−k cycles. Meanwhile, the Codeword Parity Unit contains the codeword parity $P_c(X)$ and outputs a different coefficient of $P_c(X)$ (718) according to the symbol position count in each cycle.

Figure 11:
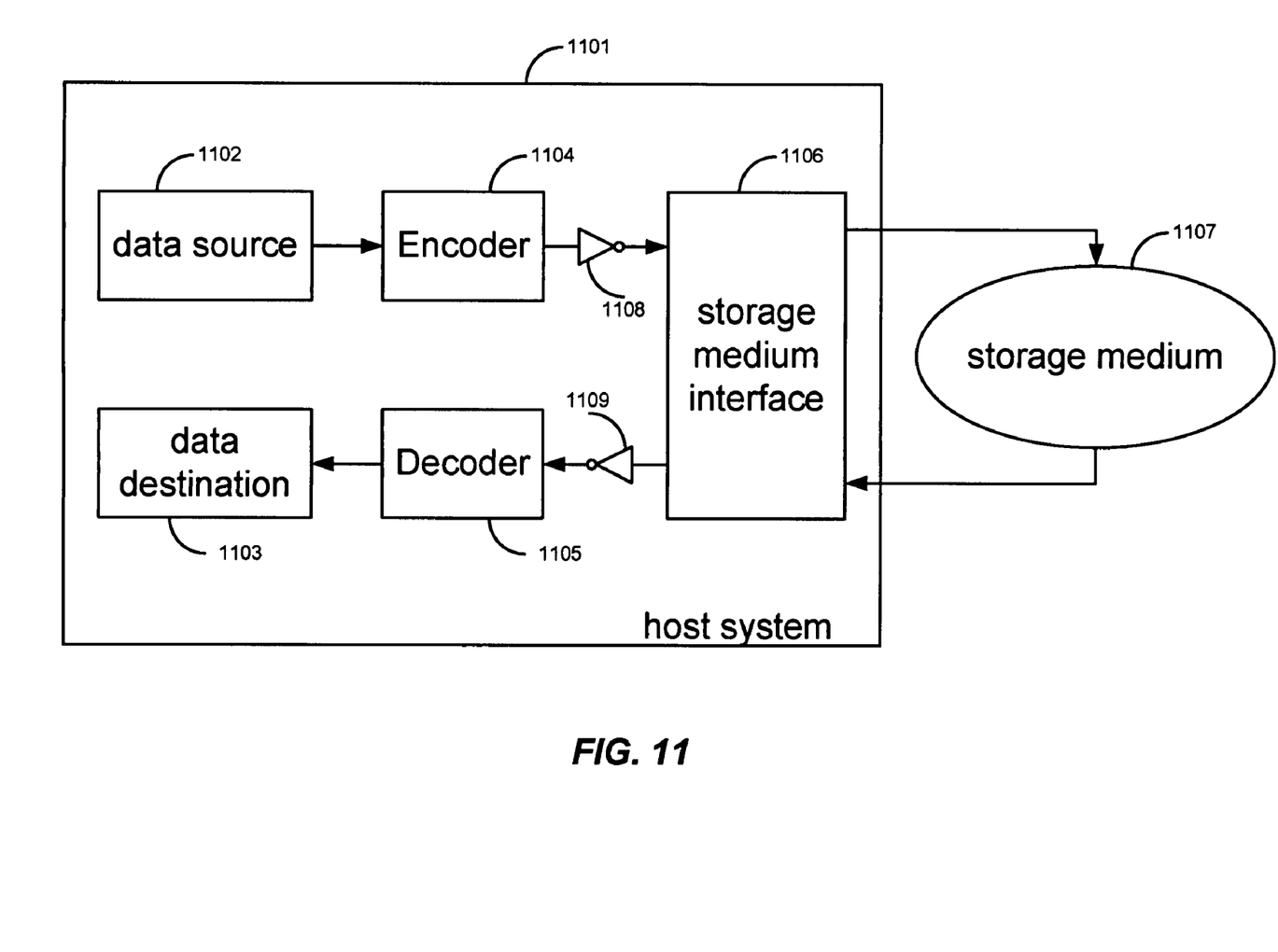
FIG. 11 illustrates a data storage system employing the Encoder of the current invention, whereby the data storage medium bits have a default value of one instead of zero.

The Encoder described above asserts that the flash memory default value of unwritten bits is zero. In the case where the default value of unwritten bits is one, as illustrated in FIG. 11, an inverter (1108, 1109) is placed on the data paths both to and from the flash memory. In other words, the data fragments and the codeword parity output by the Encoder (1104) are bit-wise inverted when being written to the flash memory. On read back, the codeword read from the flash memory, including the data fragments, the gaps and the codeword parity, is bit-wise inverted again before entering the decoder (1105).

In the case where it is fixed that there is always only one data fragment for each codeword, then the Encoder does not need to comprise the Codeword Parity Unit, and the fragment parity (622) output by the Fragment Parity Unit is the final codeword parity for the codeword.

Additional exemplary embodiments of the Encoder will now be described. The description will focus on the elements of the additional embodiments that differ from those of the first embodiment described above. Elements of the additional embodiments that are the same as the first embodiment are not repeatedly described.

DETAILED DESCRIPTION OF THE SECOND PREFERRED EMBODIMENT

Figure 8:
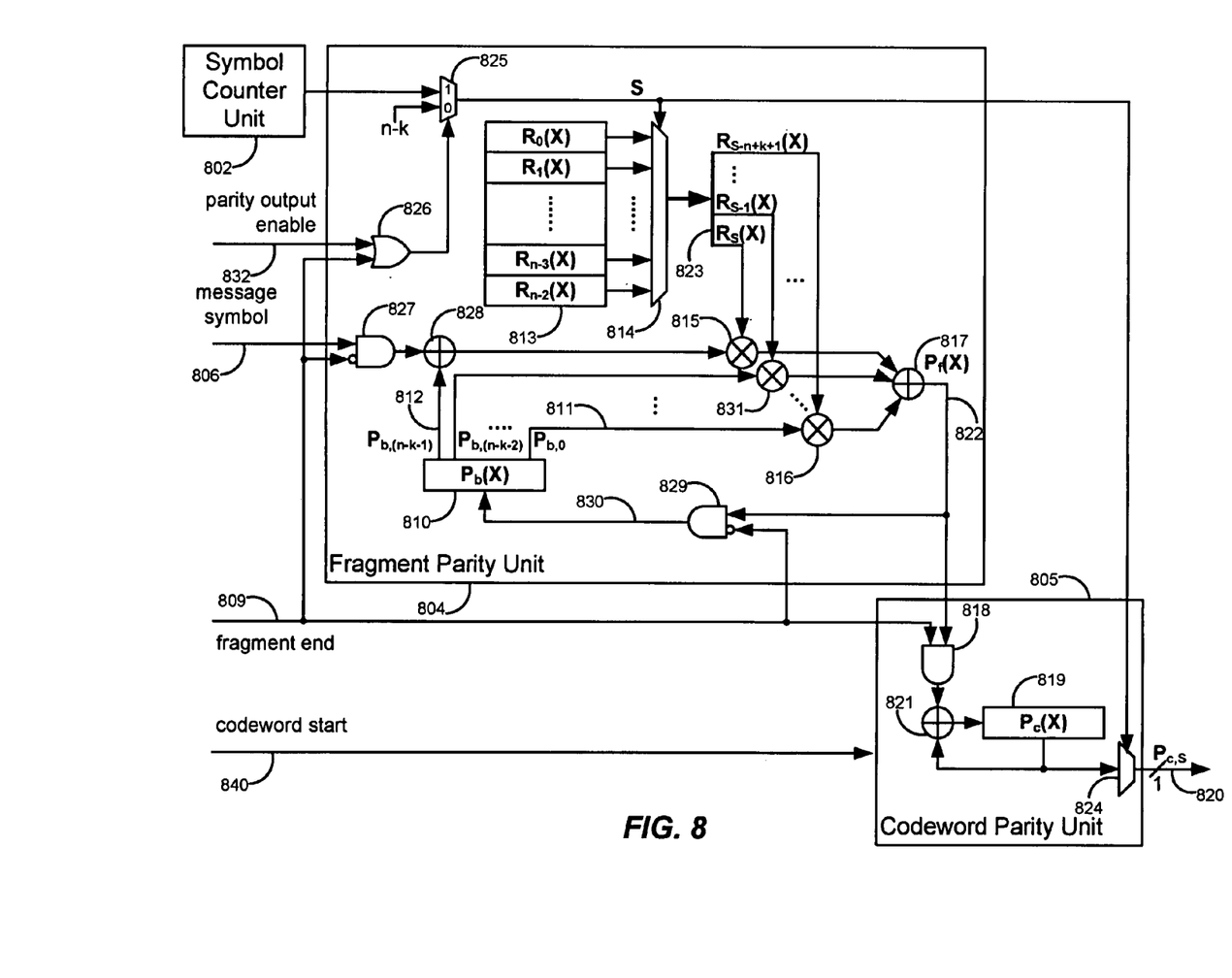
FIG. 8 illustrates a more detailed view of the Encoder of the second embodiment.

FIG. 8 illustrates an overview of the current embodiment, whereby the function of the Base Parity Unit is performed by the Fragment Parity Unit (804). Therefore the Base Parity Unit is not included in the Encoder. In the current embodiment, the Fragment Parity Unit may be implemented with the prior-art M-symbol-per-cycle encoder which is configured to process 1 symbol per cycle while computing the base parity and is configured to process n−k symbols per cycle while computing the fragment parity. The description of the current embodiment focuses on the Fragment Parity Unit. The Symbol Counter Unit (802) and the Codeword Parity Unit (805) are the same as those in the first embodiment and therefore not repeatedly described.

With respect to that of the first embodiment, the Fragment Parity Unit (804) of the current embodiment comprises several more components described as follows: a base parity register (810) which holds the result of each cycle of the computation of the base parity $P_b(X)$ and may be cleared by either the "codeword start" signal (840) or the "fragment end" signal (809). An AND gate (827) which conditionally passes the value of "message symbol" (806) when the "fragment end" signal (809) is zero; a symbol adder (828) which performs bit-wise XOR of the highest coefficient $P_{b,(n-k-1)}$ (812) of the base parity and the output of the AND gate (827) whereby the output of the symbol adder is sent to the scalar multiplier (815). The other coefficients of the base parity, $P_{b,(n-k-2)}, \ldots, P_{b,0}$, are directly sent to the scalar multipliers (831, 816). The Fragment Parity Unit further comprises an AND gate (829) which conditionally passes the output (822) of the vector adder (817) when "fragment end" (809) is zero. The output of the AND gate (829) is loaded into the base parity register (810) via signal (830) at the end of each cycle. The Fragment Parity Unit further comprises an OR gate (826) with its two inputs coupled to the "fragment end" signal (809) and the "parity output enable" signal (832); and a multiplexer (825) selecting between the symbol position count provided by the Symbol Counter Unit (802) and a fixed value n−k according to the output of the OR gate (826). As compared to the first embodiment, these additional components (825, 826, 827, 828 and 829) are to configure the Fragment Parity Unit to process 1 symbol per cycle (received via the input message symbol signal) while the "fragment end" signal is zero and to process n−k symbols in the base parity register (810) per cycle while the "fragment end" signal is one.

An exemplary operation of the current embodiment can also be illustrated by the signal timing diagram of FIG. 7, where the value of the base parity register (810) is represented by "base parity" (715).

In time slot (701), the "codeword start" signal is asserted to clear the base parity register (810) and the codeword parity register (819).

In time slot (702), the host inputs symbols $D_A, D_{A-1}, D_{A-2}$ of the first data fragment consecutively at (806) and, for each message symbol, the Fragment Parity Unit iterates once in the computation of the base parity. In this time slot, since both "fragment end" (809) and "parity output enable" (832) signals are kept zero, the OR gate (826) outputs zero causing the multiplexer (825) to output the fixed value n−k which in turn causes the lookup table multiplexer (814) to output table entries indexed from n−k to 1, i.e., $R_{n-k}(X), \ldots, R_1(X)$. These n−k remainder polynomials are sent to the scalar multipliers (815, 831, 816). Meanwhile, in each cycle, the AND gate (827) passes a message symbol to the symbol adder (828) to be bit-wise XORed with the highest coefficient $P_{b,(n-k-1)}$ (812) of the base parity register (810). The scalar multiplier (815) multiplies the symbol adder output with $R_{n-k}(X)$, while the other n−k−1 scalar multipliers each multiplies a symbol in the base parity register with one of the remainder polynomials $R_{n-k-1}(X), \ldots, R_1(X)$. The n−k polynomials output by the scalar multipliers are vector-summed by the bit-wise XOR gate (817), whose output (822) is the result of each cycle and is passed by the AND gate (829) to be loaded into the base parity register (810) at the end of each cycle.

Mathematically, for each message symbol D input at (806), the Fragment Parity Unit computes the "base parity function" defined as $(D+P_{b,n-k-1})R_{n-k}(X)+P_{b,n-k-2}R_{n-k-1}(X)+ \ldots + P_{b,0}R_1(X)$, wherein $P_{b,n-k-1}, P_{b,n-k-2}, \ldots, P_{b,0}$ are the symbols currently stored in the base parity register (810) in each cycle. The value of the base parity function for each message symbol D appears at signal (822) and is loaded into the base parity register (810) at the end of the cycle. Since $R_{n-k-1}(X), \ldots, R_1(X)$ are simply the identity polynomials $X^{n-k-1}, \ldots, X^1$, the base parity function is equal to $(D+P_{b,n-k-1})R_{n-k}(X)+P_{b,n-k-2} X^{n-k-1}+ \ldots +P_{b,0}X^1$, which is mathematically equivalent to the iterative function performed by the prior-art base encoder illustrated in FIG. 2. Therefore, in time slot (702), the Fragment Parity Unit of the current embodiment simply performs the function of the Base Parity Unit of the first embodiment.

In time slot (703), the base parity of the first data fragment has been obtained and is contained in the base parity register (810). Since "fragment end" (809) is one in this time slot, the AND gate (829) outputs zero which is loaded into the base parity register, the AND gate (827) also outputs zero causing the symbol adder (828) to simply pass the highest coefficient $P_{b,n-k-1}$ of the base parity to the scalar multiplier (815), and the OR gate (826) outputs one causing the multiplexer (825) to pass the symbol position count from the Symbol Counter Unit (802) to the select input of the lookup table multiplexer (814). In other words, in time slot (703), the Fragment Parity Unit of the current embodiment performs the same function as that of the first embodiment, and outputs the fragment parity $P_f(X)$ via (822) to the Codeword Parity Unit (805).

In time slots (704) and (705), and in time slots (706) and (707), the Fragment Parity Unit repeats the operation of time slots (702) and (703) for the second and third data fragments, respectively. After time slot (707), the final codeword parity $P_c(X)$ is obtained and stored in the register (819) in the Codeword Parity Unit (805).

In time slot (708), since "parity output enable" (832) is one, the OR gate (826) outputs one causing the multiplexer (825) to pass the symbol position count from the Symbol Counter Unit (802) to the select input of the codeword parity multiplexer (824). In other words, in time slot (708), the Codeword Parity Unit of the current embodiment performs the same function as that of the first embodiment, and outputs one codeword parity symbol per cycle at output (820).

DETAILED DESCRIPTION OF THE THIRD PREFERRED EMBODIMENT

Figure 9:
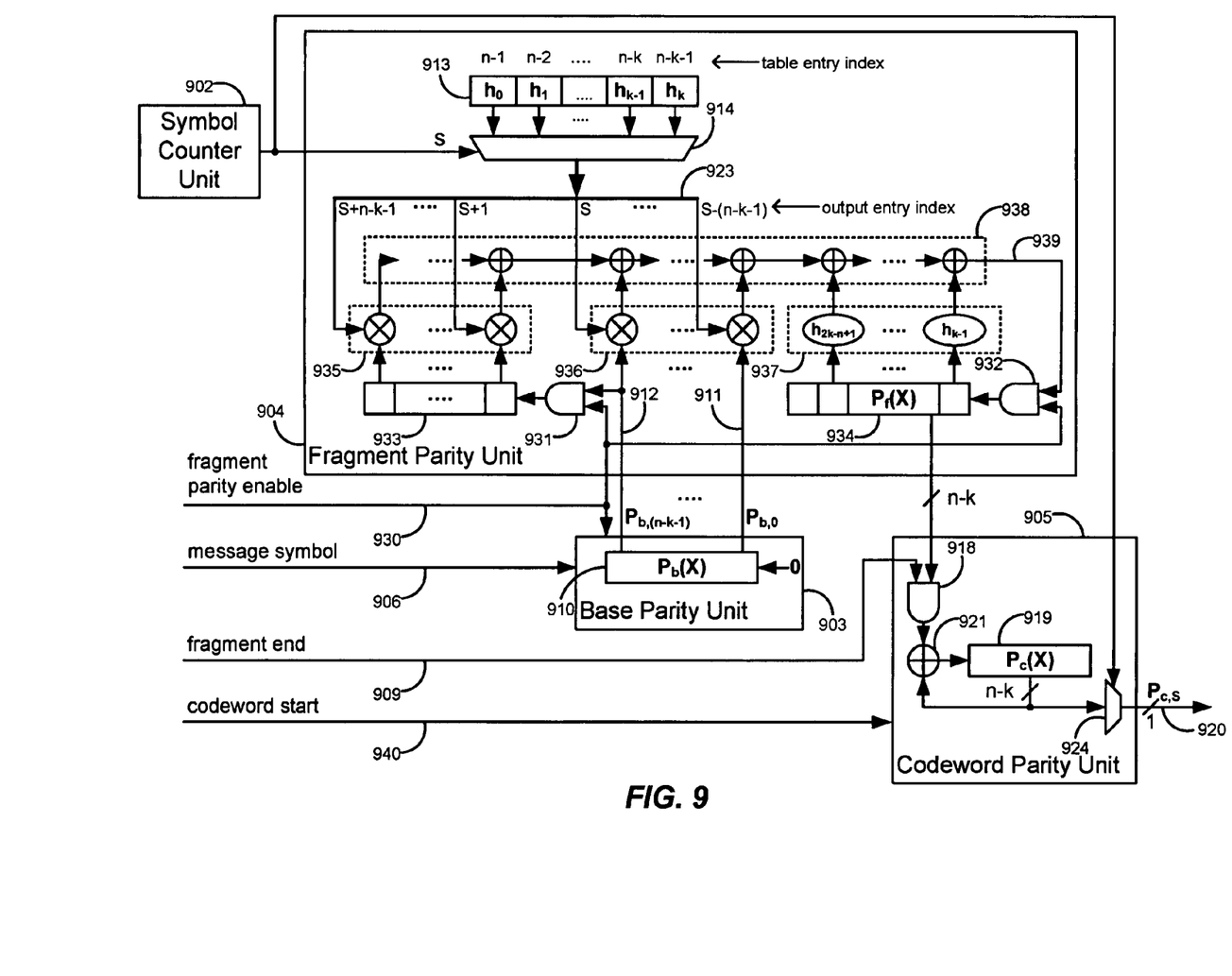
FIG. 9 illustrates a more detailed view of the Encoder of the third embodiment.

FIG. 9 illustrates an overview of the current embodiment. In the current embodiment, the Fragment Parity Unit may be implemented with a prior-art "parity-polynomial-based encoder" with modifications as described below. The Symbol Counter Unit (902) and the Codeword Parity Unit (905) are the same as those in the first embodiment and therefore not repeatedly described.

With respect to that of the first embodiment, the Encoder has one more input signal "fragment parity enable" (930) which is input to the Base Parity Unit (903) and the Fragment Parity Unit (904). The "fragment parity enable" (930) signal, when asserted, enables the Base Parity Unit to shift the base parity register (910) towards the direction of higher degrees of $P_b(X)$ (or towards the left as in FIG. 9) by one symbol per cycle with a zero symbol being shifted into the lowest position of the register (910). When "fragment parity enable" (930) is unasserted, the Base Parity Unit iteratively computes the base parity using the message symbol (906) as input in the same manner as the first embodiment. Further, the base parity register (910) may be cleared to zero by the "codeword start" signal (940).

The Fragment Parity Unit (904) comprises a lookup table with k+1 entries indexed from n−k−1 to n−1, whereby each entry contains a coefficient of the "parity check polynomial" h(X) having a degree k. The "parity check polynomial" h(X) is defined as the quotient polynomial resulting from dividing $X^n+1$ by the generator polynomial g(X) of the (n, k) Cyclic Code. Note that the coefficients of h(X), i.e. $[h_k, h_{k-1}, \ldots, h_0]$, are arranged in reversed order in the lookup table such that the highest coefficient $h_k$ is contained in the lowest entry n−k−1 and the lowest coefficient $h_0$ is contained in the highest entry n−1. In other words, the table entry of index S contains the coefficient $h_{n-1-S}$. A multiplexer (914) selects 2(n−k)−1 entries from the k+1 entries of the lookup table as the table output (923). The select input of the multiplexer is provided by the symbol position count from the Symbol Counter Unit (902) and, for a symbol position count of value S, the multiplexer selects 2(n−k)−1 entries from entry of index S−(n−k−1) to entry of index S+(n−k−1) as the table output (923). In other words, the multiplexer (914) functions as a sliding window covering a width of 2(n−k)−1 entries with its middle entry pointing at the table entry indicated by the symbol position count S, and all 2(n−k)−1 table entries covered in the sliding window are passed to table output signal (923). Note that if a section of the sliding window is outside of the range of the lookup table, then that section of the sliding window are filled with zeros on signal (923).

The Fragment Parity Unit further comprises two registers, namely the "symbol holder register" (933) capable of storing n−k−1 symbols and the "fragment parity register" (934) capable of storing n−k symbols. Both of these two registers are shift registers which shift to the left (left as in FIG. 9) by one symbol per cycle. Further, both registers may be cleared to zero by either the "codeword start" signal (940) or the "fragment end" signal (909).

The Fragment Parity Unit further comprises 2(n−k)−1 "generic multipliers" (935, 936) and n−k−1 "constant multipliers" (937). Each generic multiplier accepts two input symbols and performs multiplication of the two input symbols. The 2(n−k)−1 generic multipliers are arranged in two groups, whereby one group of n−k−1 generic multipliers (935) each multiplies a symbol in the symbol holder register (933) with one of the upper n−k−1 table entries of the table output (923), i.e. entry S+1 to entry S+(n−k−1), while the other group of n−k generic multipliers (936) each multiplies a symbol in the base parity register (910) with one of the lower n−k table entries of the table output, i.e. entry S−(n−k−1) to entry S. Each constant multiplier (937) has one input and performs multiplication of the input symbol with a fixed symbol. The fixed symbols for the n−k−1 constant multipliers are n−k−1 consecutive coefficients of h(X) from $h_{2k-n+1}$ to $h_{k-1}$, respectively. The inputs of the n−k−1 constant multipliers are the n−k−1 symbols stored in the right most positions (right as in FIG. 9) of the fragment parity register (934).

The Fragment Parity Unit further comprises a set of "symbol adders" (938) which perform bit-wise XOR of output symbols of all generic multipliers (935, 936) and all constant multipliers (937) to obtain a symbol sum (939).

The Fragment Parity Unit further comprises two AND gates, whereby the AND gate (931) conditionally passes the highest symbol (912) of the base parity register (910) to the right most position (right as in FIG. 9) of the symbol holder register (933) when "fragment parity enable" (930) is one, while the other AND gate (932) conditionally passes the symbol sum (939) to the right most position (right as in FIG. 9) of the fragment parity register (934) when "fragment parity enable" (930) is one.

As explained by Lin & Costello, according to the definition of the (n, k) Cyclic Codes, for any systematic codeword C consisting of n symbols $[C_{n-1}, \ldots, C_0]$ represented by $C(X)=C_{n-1}X^{n-1}+ \ldots +C_1X+C_0$, whereby the upper k symbols $[C_{n-1}, \ldots, C_{n-k}]$ are the message section and the lower n−k symbols $[C_{n-k-1}, \ldots, C_0]$ are the parity, there exists a parity check polynomial $h(X)=h_kX^k+ \ldots +h_1X+h_0$, which satisfies the following n−k parity check equations:

$$\sum_{j=0}^{k} h_j C_{i+k-j} = 0, \text{ for } i = n-k-1, \ldots, 0. \qquad \text{EQU00001}$$

The parity check polynomial h(X) is the quotient resulting from dividing $X^n+1$ by the generator polynomial g(X) of the (n, k) Cyclic Code. Also according to the definition of the (n, k) Cyclic Codes, the highest coefficient $h_k$ of h(X) is equal to one. Therefore, with $h_k$ substituted with one, the parity check equations (EQU00001) can be rewritten as:

$$C_i = \sum_{j=0}^{k-1} h_j C_{i+k-j}, \text{ for } i = n-k-1, \ldots, 0.$$  EQU00002

The above equation provides a formula for computing each of the n−k parity symbols. The highest parity symbol $C_{n-k-1}$ can be obtained from (EQU00002) with i=n−k−1 using k message symbols. Once $C_{n-k-1}$ is obtained, the second highest parity symbol $C_{n-k-2}$ can be obtained from (EQU00002) with i=n−k−2 using k−1 message symbols and $C_{n-k-1}$. Once $C_{n-k-2}$ is obtained, the third highest parity symbol $C_{n-k-3}$ can be obtained from (EQU00002) with i=n−k−3 using k−2 message symbols, $C_{n-k-1}$ and $C_{n-k-2}$, and so on. Finally, all n−k parity symbols can be obtained.

Recall that the Fragment Parity Unit is an (n, k) Cyclic Code encoder which computes parity for a codeword, whose message section consists of a span of n−k continuous message symbols which may be located anywhere in the message section, by using these n−k message symbols as input. For example, if the first of the n−k message symbols is located at position S in the codeword, then the n−k continuous message symbols may be represented by the codeword symbols $[C_S, C_{S-1}, \ldots, C_{S-(n-k-1)}]$. Since all other message symbols are zero, the first parity symbol $C_{n-k-1}$ can be obtained with (EQU0002) for i=n−k−1:

$$C_{n-k-1} = \sum_{j=n-1-S}^{2n-k-2-S} h_j C_{n-1-j}$$  EQU00003

After $C_{n-k-1}$ is obtained, the second parity symbol $C_{n-k-2}$ may be obtained with (EQU0002) for i=n−k−2:

$$C_{n-k-2} = \sum_{j=n-2-S}^{2n-k-3-S} h_j C_{n-2-j} + h_{k-1} C_{n-k-1}$$  EQU00004

Eventually, the last parity symbol $C_0$ may be obtained with (EQU0002) for i=0:

$$C_0 = \sum_{j=k-S}^{n-1-S} h_j C_{k-j} + \sum_{j=2k-n+1}^{k-1} h_j C_{k-j}$$  EQU00005

Before the host inputs a data fragment, the registers (933, 910 and 934) are cleared to zero. After the host inputs the data fragment, the base parity register (910) contains the base parity $P_b(X)$. If the symbol position count (902) has a value of S at this point, then the Fragment Parity Unit would compute the parity for a codeword whose message section consists of the n−k base parity symbols shifted to codeword symbol positions from S to S−(n−k−1). In other words, the n−k base parity symbols are the n−k message symbols $[C_S, C_{S-1}, \ldots, C_{S-(n-k-1)}]$ in (EQU00003) in the computation of the fragment parity. The symbol position count of S also causes the lookup table multiplexer (914) to output table entries S+(n−k−1) to S+1 (or $h_{k-S}, \ldots, h_{n-2-S}$) to the generic multipliers (935) and table entries S to S−(n−k−1) (or $h_{n-1-S}, \ldots,$ $h_{2n-k-2-S}$) to the generic multipliers (936). At this point, with the symbol holder register (933) and the fragment parity register (934) still containing zeros, the arithmetic operators of (935, 936, 937, 938) perform exactly (EQU00003) and output the highest fragment parity symbol $P_{f,n-k-1}$ (which is $C_{n-k-1}$ in EQU00003) at (939).

Meanwhile, if the "fragment parity enable" signal (930) is asserted, then the symbol holder register (933), the base parity register (910), and the fragment parity register (934) all shift to the left (left as in FIG. 9) by one symbol position after the first cycle, with their right most positions loaded with the highest symbol (912) of the base parity register, a zero symbol, and the highest fragment parity symbol $P_{f,n-k-1}$ (939) output by the symbol adders (938), respectively. Therefore, in the second cycle, the arithmetic operators of (935, 936, 937, 938) perform exactly the formula of (EQU00004) and output the second highest fragment parity symbol $P_{f,n-k-2}$ (which is $C_{n-k-2}$ in EQU00004) at (939).

Finally, in the last of n−k cycles, the arithmetic operators of (935, 936, 937, 938) perform exactly the formula of (EQU00005) and output the lowest fragment parity symbol $P_{f,0}$ (which is $C_0$ in EQU00005) at (939).

Therefore, after the host inputs a data fragment, the "fragment parity enable" signal (930) is kept asserted for n−k cycles, whereby in each cycle, the registers (933, 910, 934) shift left by one symbol position and the arithmetic operators of (935, 936, 937, 938) output one fragment parity symbol at signal (939) which is loaded into register (934). After n−k cycles, the register (934) contains the fragment parity $P_f(X)$. Then, "fragment end" (909) is asserted causing the Codeword Parity Unit (905) to accumulate the fragment parity into its register (919).

Figure 10:
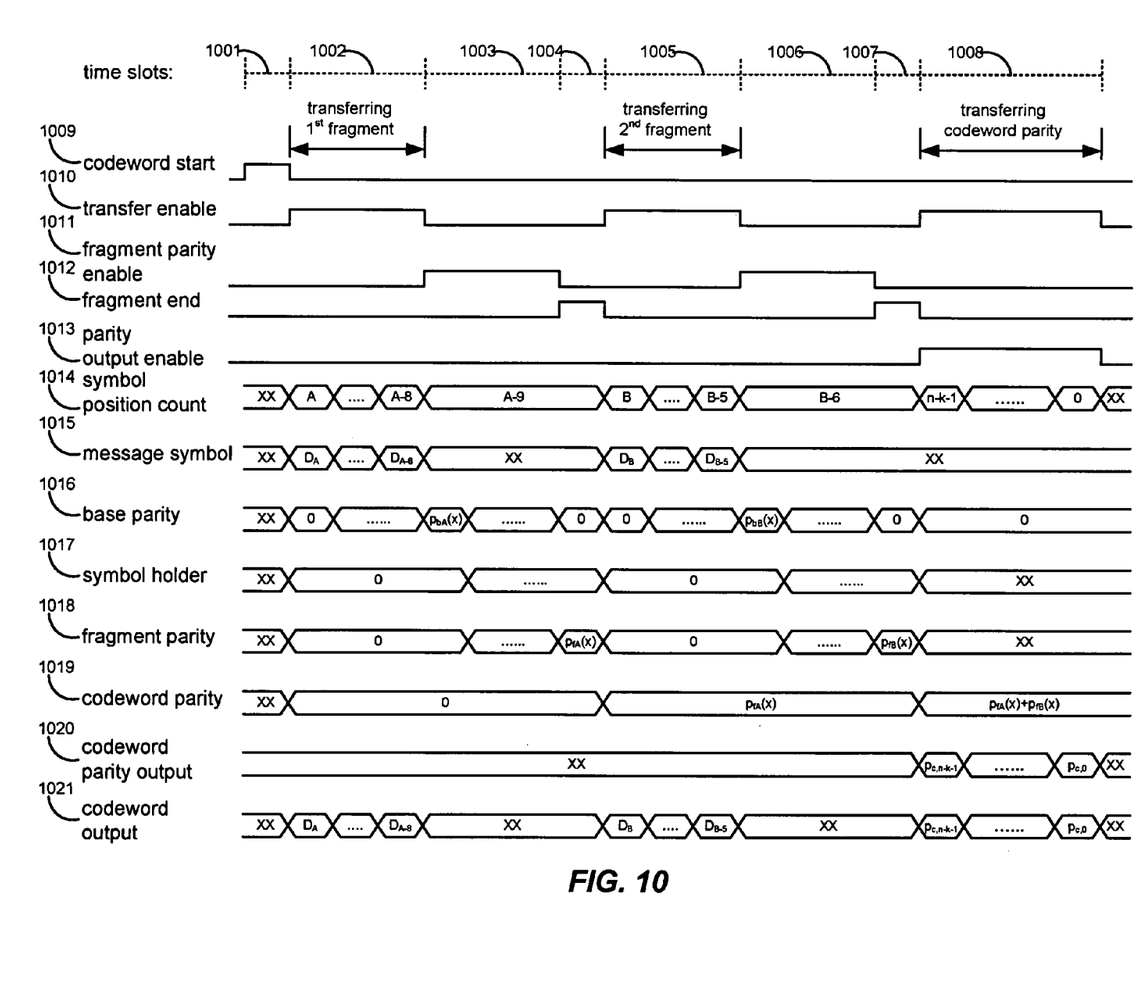
FIG. 10 illustrates an exemplary operation of the encoding process of the third embodiment in terms of signal timing diagrams.

FIG. 10 illustrates an exemplary encoding operation of the current embodiment in terms of signal timing diagrams. In this exemplary encoding operation, the host writes two data fragments starting at symbol positions A and B and having a length of 9 and 6 symbols, respectively, to the flash message area. In FIG. 10, fragment parity enable (1011), base parity (1016), symbol holder (1017), fragment parity (1018) and codeword parity (1019) represent values of fragment parity enable (930), the base parity register $P_b(X)$ (910), symbol holder register (933), fragment parity register $P_f(X)$ (934) and codeword parity register $P_c(X)$ (919) in FIG. 9, respectively, while codeword parity output (1020) and codeword output (1021) represent values of the "codeword parity" signal (513) and the "codeword output" signal (512) in FIG. 5, respectively.

In time slot (1001), "codeword start" (1009) is asserted causing base parity (1016), symbol holder (1017), fragment parity (1018), and codeword parity (1019) to be cleared to zero. Meanwhile, the Symbol Counter Unit is loaded with the symbol position of the first symbol of the first data fragment. In time slot (1002), in the same manner as the first embodiment, the Base Parity Unit iteratively computes the base parity and the Symbol Counter Unit decrements by one per cycle as the host inputs symbols ($D_A, \ldots, D_{A-8}$) of the first data fragment.

In time slot (1003), the "fragment parity enable" signal (1011), is asserted for n−k cycles causing the Fragment Parity Unit to be enabled for n−k cycles. After time slot (1003), the fragment parity register (1018) contains the fragment parity $P_f(X)$ of the first data fragment and the base parity register (910) contains zero symbols. In time slot (1004), "fragment end" (1012) is asserted causing symbol holder (1017) and fragment parity (1018) to be cleared to zero and the codeword parity register (1019) to accumulate the fragment parity of the first data fragment.

In time slots (1005, 1006, 1007), the operation of (1002, 1003, 1004) is repeated for the second data fragment. In time slot (1008), the Encoder output the codeword parity symbols in the same manner as the first embodiment.

Although the description of the present invention uses the flash memory as an example of the data storage medium, it is obvious to those skilled in the art that the same principles of the present invention apply to any data storage medium which has a default value for all unwritten bits.

What is claimed is:

1. An (n, k) cyclic code encoder (the Encoder), comprising:
an input symbol signal configured to receive message symbols from an external host;
a symbol counter unit configured to output a position of the codeword symbol being input, wherein the symbol counter unit may be loaded with a value by an external host and decremented for each symbol being input;
a base parity unit coupled to the input symbol signal and configured to perform systematic encoding based on said (n, k) cyclic code, wherein the base parity unit may be initialized by a reset mechanism such as an input reset signal, wherein the base parity unit computes parity for each data fragment received via the input symbol signal, wherein the parity computed by the base parity unit is the base parity;
a fragment parity unit coupled to the base parity unit and the symbol counter unit and configured to perform systematic encoding based on said (n, k) cyclic code, wherein the fragment parity unit computes parity for each base parity mathematically shifted to the symbol position indicated by the symbol counter unit, wherein the parity computed by the fragment parity unit is the fragment parity;
a codeword parity unit coupled to the fragment parity unit and configured to perform vector sum of the fragment parities, wherein the vector sum computed by the codeword parity unit is the codeword parity; and
an output symbol signal configured to output the codeword parity as the output of the Encoder.

2. The Encoder as defined in claim 1, wherein the base parity unit may be implemented with either a prior-art base encoder or a prior-art M-symbol-per-cycle encoder, depending on the rate at which the external host inputs message symbols.

3. The Encoder as defined in claim 1, wherein the fragment parity unit may be implemented with either a prior-art M-symbol-per-cycle encoder or a prior-art parity-polynomial-based encoder.

4. The Encoder as defined in claim 1, wherein the codeword parity unit may be implemented with a register unit and an XOR logic gate, wherein the register unit may be cleared to zero by a reset mechanism such as an input reset signal, wherein the XOR gate performs bit-wise XOR operation of the fragment parity output by the fragment parity unit and the content of the register unit, wherein the output of said XOR gate is the sector sum of all the fragment parities computed thus far and is loaded into the register unit when the codeword parity unit is enabled.

5. The Encoder as defined in claim 1, wherein an external host may operate the Encoder according to a method, the method comprising:
performing bit-wise inversion of all symbols of the data fragments and the parity of a codeword, wherein the parity of said codeword is output of the Encoder, before said symbols are sent to the data storage media to be stored; and
performing bit-wise inversion of all symbols of the codeword after said codeword, potentially containing errors, is read back from the data storage media and before syndromes are computed for said codeword.

6. The Encoder as defined in claim 1, wherein an external host may operate the Encoder to compute the parity of a codeword according to a method, the method comprising steps:
a) activating the reset mechanism to clear the register unit in the codeword parity unit to zero;
b) activating the reset mechanism to initialize the base parity unit and loading the symbol counter unit with the symbol position of the first symbol of a data fragment;
c) inputting said data fragment via the input symbol signal while keeping the base parity unit enabled to compute the base parity;
d) enabling the fragment parity unit to compute the fragment parity;
e) enabling the codeword parity unit to perform vector sum of the currently computed fragment parity with all previously computed fragment parities;
f) repeating b), c), d) and e) for all remaining data fragments of the codeword; and
g) reading the parity of said codeword via the output symbol signal.

7. The Encoder as defined in claim 1, wherein the Encoder does not comprise the codeword parity unit, wherein the output symbol signal is configured to output the fragment parity as the output of the Encoder.

8. The Encoder as defined in claim 1, wherein an external host may operate the Encoder to compute the parity of a codeword according to a method, the method comprising steps:
a) activating the reset mechanism to initialize the base parity unit and loading the symbol counter unit with the symbol position of the first symbol of a data fragment;
b) inputting said data fragment via the input symbol signal while keeping the base parity unit enabled to compute the base parity;
c) enabling the fragment parity unit to compute the fragment parity; and
d) reading the parity of said codeword via the output symbol signal.

* * * * *